(12) United States Patent
Ruan

(10) Patent No.: US 7,462,543 B1
(45) Date of Patent: Dec. 9, 2008

(54) FLASH MEMORY CELL TRANSISTOR WITH THRESHOLD ADJUST IMPLANT AND SOURCE-DRAIN IMPLANT FORMED USING A SINGLE MASK

(75) Inventor: Jun Ruan, Santa Clara, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 11/952,337

(22) Filed: Dec. 7, 2007

(51) Int. Cl.
*H01L 21/336* (2006.01)

(52) U.S. Cl. .................. 438/289; 438/290; 257/288; 257/E21.177; 257/E27.066

(58) Field of Classification Search .............. 438/289, 438/290, 301; 257/288, 401, E21.177, E27.066
See application file for complete search history.

(56) References Cited

U.S. PATENT DOCUMENTS

| 5,877,525 | A | 3/1999 | Ahn |
| 6,410,394 | B1 * | 6/2002 | Shao et al. .................. 438/289 |
| 6,949,784 | B2 | 9/2005 | Moore |
| 7,268,040 | B2 | 9/2007 | Shim |

* cited by examiner

*Primary Examiner*—Quoc D Hoang
(74) *Attorney, Agent, or Firm*—Patent Law Group LLP; Carmen C. Cook

(57) ABSTRACT

A method for forming an NMOS transistor for use in a flash memory cell on a P-type semiconductor structure includes forming a photoresist layer over the semiconductor structure and patterning the photoresist layer using a source/drain mask for the NMOS transistor; forming a first N-type region and a second N-type region by a first implantation process using the patterned photoresist as an implant mask where the first implantation process uses a high implant dose at a low implant energy and the first and second N-type regions form the source and drain regions of the NMOS transistor; forming a channel doped region by a second implantation process using the patterned photoresist as an implant mask where the second implantation process uses a low implant dose at a high implant energy and the channel doped region is formed for adjusting a threshold voltage of the NMOS transistor.

6 Claims, 4 Drawing Sheets

FLASH MEMORY CELL TRANSISTOR WITH THRESHOLD ADJUST IMPLANT AND SOURCE-DRAIN IMPLANT FORMED USING A SINGLE MASK

FIELD OF THE INVENTION

The invention relates to nonvolatile memory cells formed on a semiconductor integrated circuit and, in particular, to a flash memory cell formed on a semiconductor integrated circuit using a single polysilicon process.

DESCRIPTION OF THE RELATED ART

U.S. Pat. No. 6,949,784 to Paul M. Moore describes a flash memory cell that is fabricated using a conventional CMOS or BiCMOS fabrication process. The '784 patent is incorporated herein by reference in its entirety. The flash memory cell of the '784 patent includes a coupling capacitor and an NMOS field-effect transistor. Detail construction and operation of the flash memory cell are fully described in the '784 patent specification and will not be repeated. A brief description of the flash memory cell of the '784 patent is provided below.

FIGS. 1A and 1B illustrate a cross-sectional view of the flash memory cell of the '784 patent and its equivalent circuit. Referring to FIGS. 1A and 1B, a flash memory cell is formed on a p-type substrate 102 and includes an NMOS transistor 150 and a coupling capacitor 252. Coupling capacitor 252 is formed with a p-type dopant region 280 as one electrode and a polysilicon gate 112B as the other electrode. A gate oxide layer 110B forms the dielectric of the capacitor. Coupling Capacitor 252 is formed in an N-Well 104 in P-sub 102. In the present embodiment, p-type dopant region 280 is a p-type base dopant region (P-Base) used to form the base region of a bipolar transistor in a BiCMOS fabrication process. The polysilicon electrode 112B of coupling capacitor 252 forms the floating gate of the flash memory cell and the polysilicon electrode 112B extends to form the gate terminal of NMOS transistor 150. The P-Base dopant region 280 is connected through a p+dopant region 222 to form the control terminal of the flash memory cell.

NMOS transistor 150 is formed in a P-Well 108 and includes source region 118 and drain region 120 formed adjacent to the polysilicon gate 112A. Polysilicon gate 112A is separated from P-sub 102 by a gate oxide layer 110A. Source region 118 and drain region 120, self-aligned to polysilicon gate 112A, are formed using an implantation process referred to as ZN+ implantation. The notation "ZN" is used to distinguish the source/drain implants of transistor 150 from the source/drain implants used to form standard transistors in sub-micron CMOS process. Standard transistors in sub-micron CMOS processes are typically formed using lightly doped regions adjacent the polysilicon gate and a sidewall spacer to space the heavily doped source/drain implants away from the edge of the polysilicon gate. However, for NMOS transistor 150 formed as part of a flash memory cell, it is necessary for the heavily doped source/drain regions to be adjacent the polysilicon gate to facilitate Fowler-Nordheim tunneling. Therefore, a ZN+ implantation process is used to form heavily doped source/drain regions 118 and 120 self-aligned to polysilicon gate 112A of NMOS transistor 150.

As thus constructed, the polysilicon electrode 112B of coupling capacitor 252 and the gate terminal of transistor 150 form a floating gate. Coupling capacitor 252 is used to couple control voltages from control terminal 260 to the floating gate. The flash memory cell of the '784 patent further includes a bias terminal 262 electrically connected to an N+dopant region 224 formed in N-Well 104. Bias terminal 262 receive bias voltages to reverse bias the PN junction (diode 254) formed by P-Base 280 and N-Well 104 and to reverse bias the PN junction (diode 154) formed by N-Well 104 and P-sub 102 to prevent substrate conduction.

SUMMARY OF THE INVENTION

According to one embodiment of the present invention, a method for forming an NMOS transistor for use in a flash memory cell on a P-type semiconductor structure, where the NMOS transistor has a polysilicon gate being a floating gate and being connected to an electrode of a coupling capacitor and the other electrode of the coupling capacitor being the control terminal of the flash memory cell, includes forming a P-well in the P-type semiconductor structure; defining active areas on the P-type semiconductor structure including at least a first active area in which a channel region, a source region and a drain region are to be formed; forming a gate dielectric layer over the P-type semiconductor structure; forming a polysilicon layer over the gate dielectric layer and patterning the polysilicon layer to form the polysilicon gate of the NMOS transistor; forming a photoresist layer over the semiconductor structure and patterning the photoresist layer using a source/drain mask for the NMOS transistor where the patterned photoresist layer exposes the first active area; forming a first N-type region and a second N-type region by a first implantation process using the patterned photoresist as an implant mask where the first implantation process uses a high implant dose at a low implant energy and the first and second N-type regions are self-aligned to the polysilicon gate and form the source and drain regions of the NMOS transistor; forming a channel doped region by a second implantation process using the patterned photoresist as an implant mask where the second implantation process uses a low implant dose at a high implant energy and the channel doped region is formed under the polysilicon gate for adjusting a threshold voltage of the NMOS transistor; and removing the patterned photoresist.

The present invention is better understood upon consideration of the detailed description below and the accompanying drawings.

DETAILED DESCRIPTION OF THE PREFERRED EMBODIMENTS

Figure 1A:
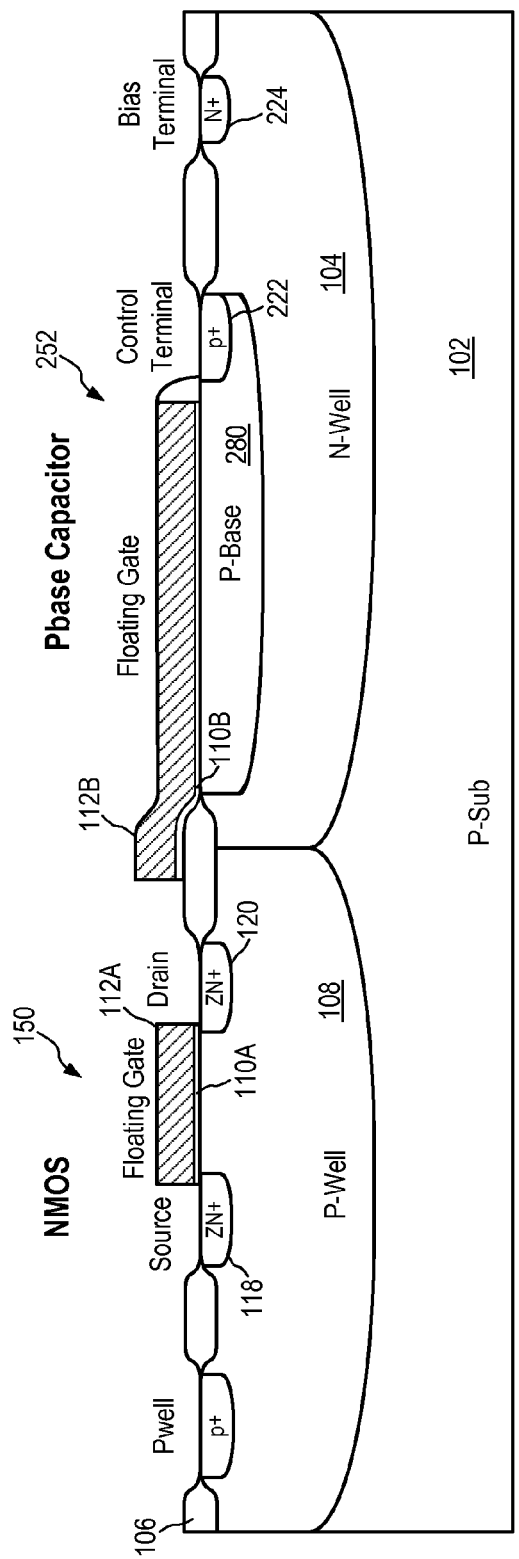
FIGS. 1A and 1B illustrate a cross-sectional view of the flash memory cell of the '784 patent and its equivalent circuit.
Figure 1B:
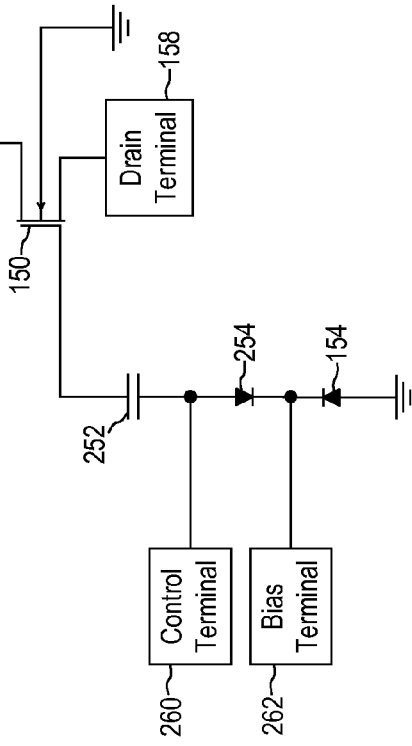

In accordance with the principles of the present invention, a fabrication process for an NMOS transistor for a flash memory cell includes performing the threshold voltage (VT) adjust implant and the heavily doped source/drain implant using a single mask. More specifically, the threshold voltage (VT) adjust implant is carried out using the source/drain implant mask. The NMOS transistor thus formed includes a floating gate insulated from a semiconductor substrate by a gate dielectric and heavily doped source/drain regions self-aligned to the floating gate. In this manner, the threshold voltage of the NMOS transistor can be adjusted without requiring additional masking steps.

In conventional fabrication processes, a threshold adjust implant process is carried out to adjust the doping level of p-type or n-type dopants near the surface of the substrate so that the desired threshold voltages (VT) of the N-type or P-type field effect transistors can be obtained. Typically, the threshold adjust implant process is carried out on the bare semiconductor substrate prior to formation of the polysilicon gate. Thus, all the NMOS transistors formed on the semiconductor substrate are adjusted to the same threshold voltage and likewise for the PMOS transistors.

In some applications, flash memory cells are formed in an integrated circuit including other circuitries formed by standard transistors. As described above, the basic flash memory cell includes a capacitor coupled to an NMOS transistor. It is sometimes necessary to use a threshold voltage for the memory cell NMOS transistor different than the threshold voltage for the standard transistors. In that case, an additional masking step is required to mask out the channel area of the standard NMOS transistor so that the specific threshold adjust implant can be carried out just for the memory cell NMOS transistor. The additional masking step is undesirable as it increases the cost and complexity of the fabrication process.

According to one aspect of the present invention, a fabrication process for a memory cell NMOS transistor for a flash memory cell uses the source/drain mask to perform both the threshold adjust implantation and the heavily doped source/drain implantation. In this manner, the threshold voltage of the memory cell NMOS transistor can be individually set, apart from the threshold voltage of the standard transistors that are also formed on the same integrated circuit. More importantly, the threshold adjust implant for the memory cell NMOS transistor is performed without additional masking steps. The electrical characteristic of the NMOS transistor can be improved without additional cost or added process complexity.

In one embodiment, the fabrication process of the present invention is used to form the flash memory cell described in the '784 patent. The fabrication process of the present invention allows the threshold voltage of the memory cell NMOS transistor of the flash memory cell to be individually tailored without requiring any additional masking steps. In other embodiments, the fabrication process of the present invention can also be applied to flash memory cells formed using other structures.

Figure 2:
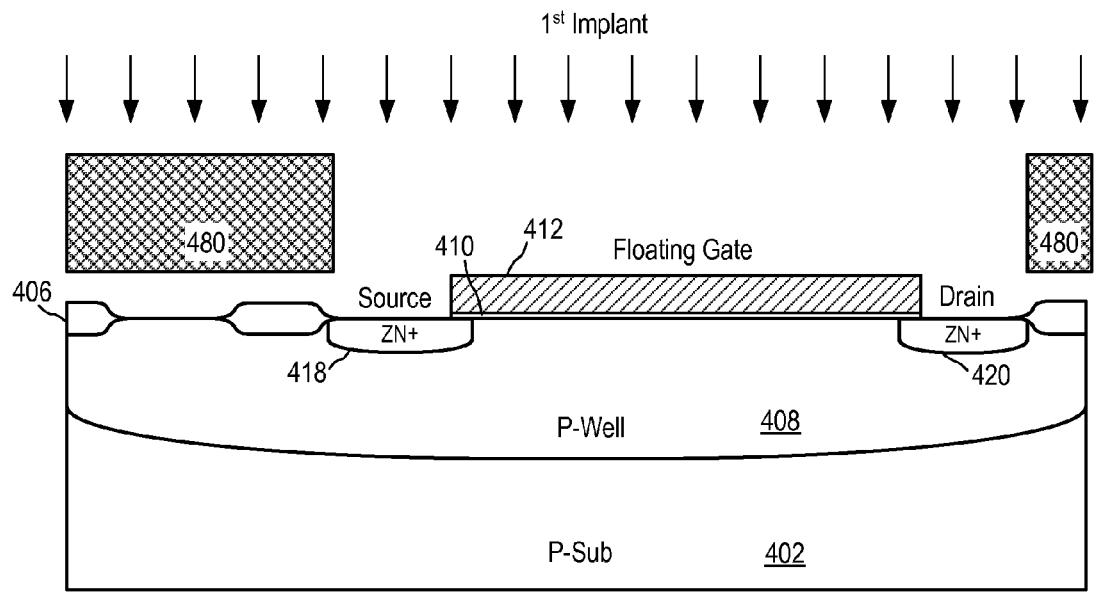
FIG. 2 is a cross-sectional view of an NMOS transistor for a flash memory cell in an intermediate processing step according to one embodiment of the present invention.
Figure 3:
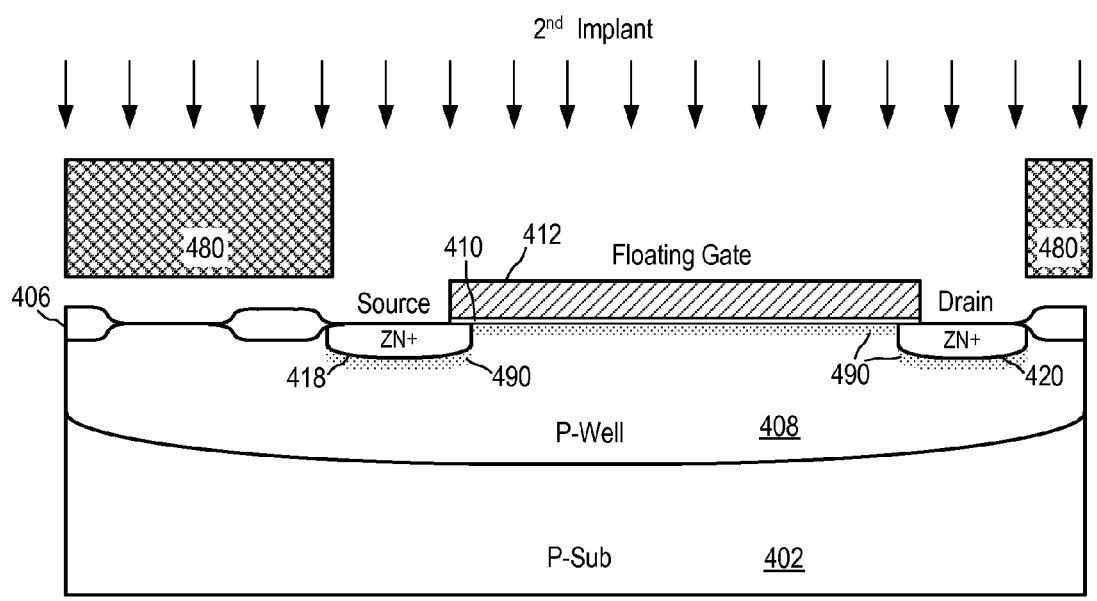
FIG. 3 is a cross-sectional view of an NMOS transistor for a flash memory cell in a processing step subsequent to that of FIG. 2 according to one embodiment of the present invention.
Figure 4:
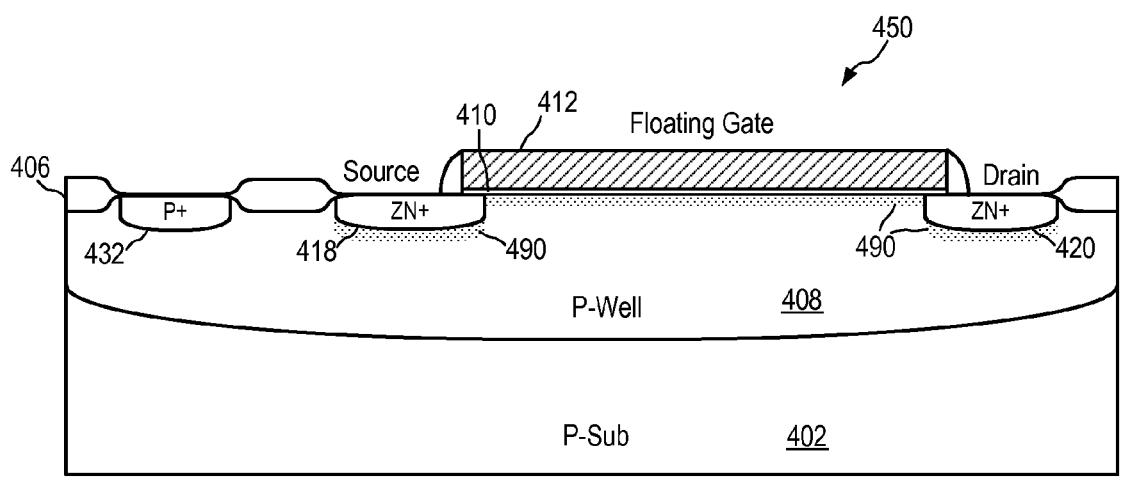
FIG. 4 is a cross-sectional view of an NMOS transistor for a flash memory cell formed by the fabrication process according to one embodiment of the present invention.
Figure 5:
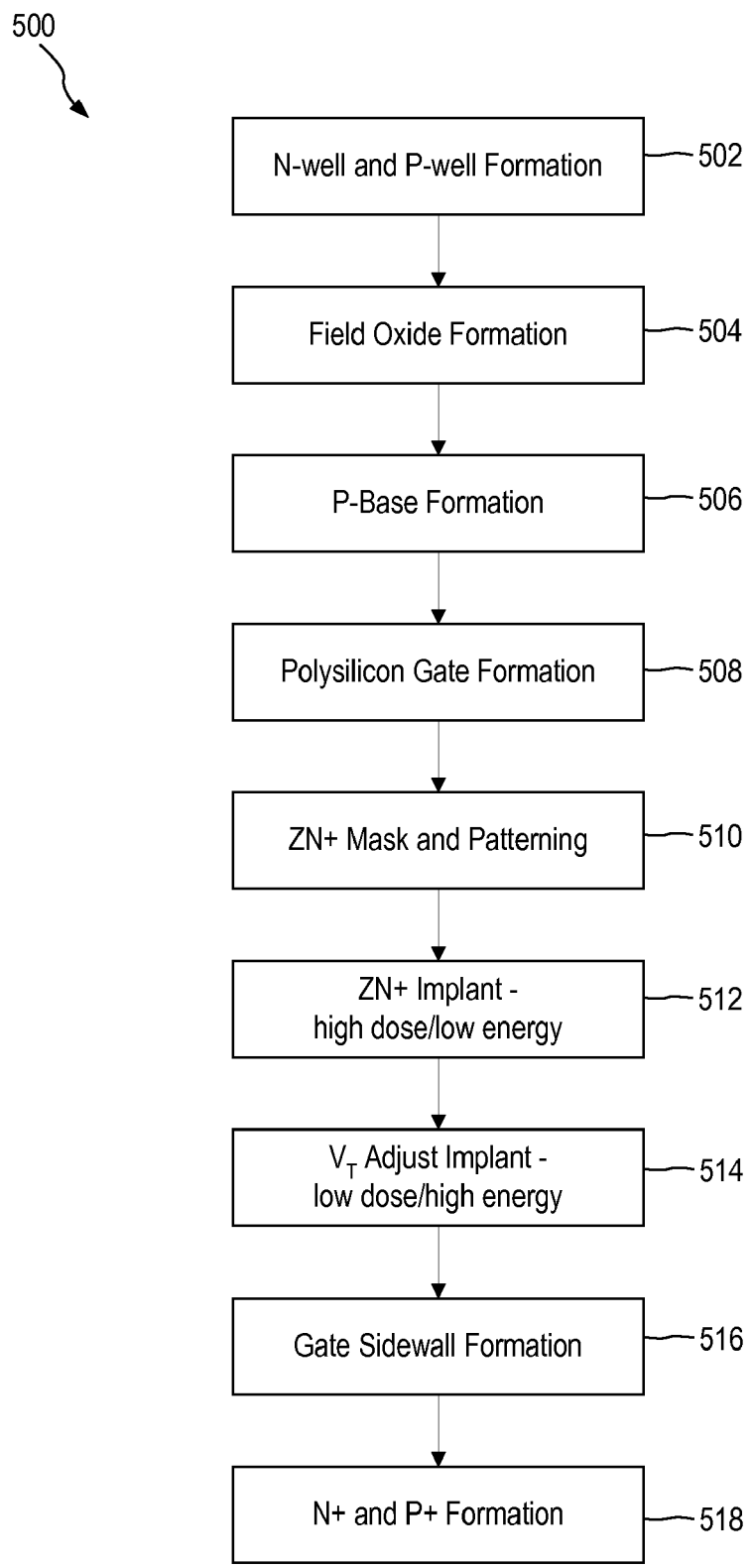
FIG. 5 is a flow chart illustrating the fabrication process for an NMOS transistor in a flash memory cell according to one embodiment of the present invention.

The fabrication process for forming the memory cell NMOS transistor of a flash memory cell will be described with reference to FIGS. 2-5. FIG. 2 is a cross-sectional view of an NMOS transistor for a flash memory cell in an intermediate processing step according to one embodiment of the present invention. FIG. 3 is a cross-sectional view of an NMOS transistor for a flash memory cell in a processing step subsequent to that of FIG. 2 according to one embodiment of the present invention. FIG. 4 is a cross-sectional view of an NMOS transistor for a flash memory cell formed by the fabrication process according to one embodiment of the present invention. FIG. 5 is a flow chart illustrating the fabrication process for an NMOS transistor in a flash memory cell according to one embodiment of the present invention. The fabrication process of the present invention is pertinent to the formation of the NMOS memory cell transistor. The fabrication process of the present invention does not change or affect the formation of the coupling capacitor and the coupling capacitor can be formed using any conventional means, such as that described in the '784 patent.

Referring to FIGS. 2-5, a fabrication process 500 uses a p-type substrate 402 the starting material and N-well and P-wells are formed on the p-substrate 402 (step 502). In one embodiment, a p-type epitaxial layer is formed on the p-type substrate and the N-wells and P-wells are formed in the p-type epitaxial layer. The exact construction of the substrate is not critical to the practice of the present invention and any substrate structure, including epitaxial layer and/or buried layer may be used.

Fabrication process 500 forms an NMOS transistor 450 in a P-well 408 formed in p-substrate 402. After the well formation step, field oxidation is performed (step 504) to form the field oxide layer 406 which defines the active areas of the NMOMS transistor 450. The field oxidation process is conventional and is typically carried out using a nitride mask. The nitride mask is patterned to cover the areas of the transistor devices and the exposed areas of the nitride mask are subject to oxidation to grow the field oxide layer.

Following the field oxidation process, a p-type base diffusion region (280) is formed (step 506) which acts as the bottom electrode of the coupling capacitor (FIG. 1A). After the p-base formation, a gate oxide layer is grown and a polysilicon layer is deposited and patterned to form the polysilicon gates (step 508), including floating gate 412 of NMOS transistor 450.

Referring to FIG. 2, after the floating gate 412 is patterned, the source/drain regions of the NMOS transistor 450 can now be formed. The source/drain regions will be self-aligned to the edge of the polysilicon gate 412 and bounded by the field oxide layer 406. To form the source/drain regions of NMOS transistor 450, a photoresist layer 480 is deposited onto p-substrate 402 and the ZN+ mask defining areas receiving the heavily doped N+ implantation is applied (step 510). After the photoresist layer 480 is developed, only the floating gate 412 and the source/drain areas of the transistor are exposed.

With the ZN+ mask pattern defined, fabrication process 500 proceeds to perform a first implantation process. The first implantation process (step 512) is performed for the formation of the ZN+ source/drain regions 418 and 420. The first implantation step is performed at high dose but with low implant energy to form heavily doped source/drain regions that are near the surface of the substrate 402. The implantation is performed using the patterned photoresist as an implant mask so that only exposed areas of the photoresist layer 480 receives the first implantation. After the first implantation step, the transistor structure of FIG. 2 results. Because of the low implant energy, the first implant do not penetrate the polysilicon gate 412 but rather the implanted dopants are self-aligned with the polysilicon gate.

After the first implantation step and before the patterned photoresist 480 is removed, a second implantation process is carried out (step 514). The second implantation process is performed for adjusting the threshold voltage of the NMOS transistor 450. The second implantation process is performed at low dose but at high implant energy to cause the implanted dopant to penetrate the polysilicon gate 412 to reach the channel region of the transistor. The dose of the second implantation is selected to modify the doping concentration at the channel region of the transistor so as to adjust the threshold voltage of the transistor. The implantation is performed using the patterned photoresist as an implant mask so that only exposed areas of the photoresist layer 480 receives the second implantation. After the second implantation step, the transistor structure of FIG. 3 results. Because of the high implant energy, the second implant penetrates the polysilicon gate 412 and formed doped regions 490 in the channel region and also under the source/drain regions 418, 420. Because the second implant is of low dose, the presence of doped regions 490 under the source/drain regions do not affect the electrical characteristics of the transistor. The doped region 490 under the polysilicon gate 412, referred to as the channel doped region, modifies the threshold voltage of the NMOS transistor 450.

In the present embodiment, the first implantation step for forming the ZN+ source/drain regions are performed first, followed by the second implantation step for adjusting the threshold voltage. The order of the two implantation steps is not critical and they can be reversed in other embodiments of the present invention. That is, in other embodiments, the low dose/high energy implant can be performed first followed by the high dose/low energy implant.

After the second implantation step, the photoresist layer 480 is removed and the remaining processing steps for forming the NMOS transistor 450 follows. For example, a gate sidewall formation process may be carried out (step 516) and then the N+ and P+ implantation process for the standard transistors are performed (step 518). FIG. 4 illustrates NMOS transistor 450 after the standard N+ and P+ implantation process. P+ region 432 is formed to provide a contact to P-Well 408. Other conventional processing steps may follow to form insulating layers and contacts to the dopant regions of transistor 450. Metallization process may also follow to complete the electrical connection of the transistors formed on substrate 402.

Fabrication process 500 of the present invention enables the threshold adjust implantation process to be carried out using the same mask as the source/drain implant of the transistor. In this manner, the threshold voltage of the memory cell NMOS transistor 450 can be selectively tailored to achieve the desired operating characteristics.

In one embodiment, the ZN+ source/drain implant is performed using arsenic with a dose in the order of $10^{15}$ and an implant energy of less than 100 KeV. The threshold adjust implant is performed using any appropriate dopants, such as boron, with a dose in the order of $10^{12}$ and an implant energy of greater than 100 KeV. The implant energy for the threshold adjust implant is a function of the dopant species and the implant energy is selected as needed to allow the dopant species to penetrate through the polysilicon gate which has a thickness of several thousand angstroms.

The above detailed descriptions are provided to illustrate specific embodiments of the present invention and are not intended to be limiting. Numerous modifications and variations within the scope of the present invention are possible. The present invention is defined by the appended claims.

I claim:

1. A method for forming an NMOS transistor for use in a flash memory cell on a P-type semiconductor structure, the NMOS transistor having a polysilicon gate being a floating gate and being connected to an electrode of a coupling capacitor, the other electrode of the coupling capacitor being the control terminal of the flash memory cell, the method comprising:

forming a P-well in the P-type semiconductor structure;

defining active areas on the P-type semiconductor structure including at least a first active area in which a channel region, a source region and a drain region are to be formed;

forming a gate dielectric layer over the P-type semiconductor structure;

forming a polysilicon layer over the gate dielectric layer and patterning the polysilicon layer to form the polysilicon gate of the NMOS transistor;

forming a photoresist layer over the semiconductor structure and patterning the photoresist layer using a source/drain mask for the NMOS transistor, the patterned photoresist layer exposing the first active area;

forming a first N-type region and a second N-type region by a first implantation process using the patterned photoresist as an implant mask, the first implantation process using a high implant dose at a low implant energy, the first and second N-type regions being self-aligned to the polysilicon gate and forming the source and drain regions of the NMOS transistor;

forming a channel doped region by a second implantation process using the patterned photoresist as an implant mask, the second implantation process using a low implant dose at a high implant energy, the channel doped region being formed under the polysilicon gate for adjusting a threshold voltage of the NMOS transistor; and removing the patterned photoresist.

2. The method of claim 1, wherein forming a first N-type region and a second N-type region by a first implantation process comprises performing the first implantation process using an implant dose of at least $10^{15}$ and an implant energy of less than 100 KeV.

3. The method of claim 1, wherein forming a channel doped region by a second implantation process comprises performing the second implantation process using an implant dose of about $10^{12}$ and an implant energy of greater than 100 KeV.

4. The method of claim 1, wherein the P-type semiconductor structure comprises a P-type semiconductor substrate and a P-type epitaxial layer form on the semiconductor substrate.

5. The method of claim 1, wherein the first implantation process is performed before the second implantation process.

6. The method of claim 1, wherein the first implantation process is performed after the second implantation process.

* * * * *